(12) United States Patent
Whitehead et al.

(10) Patent No.: US 7,842,134 B2
(45) Date of Patent: Nov. 30, 2010

(54) DIAMOND BASED SUBSTRATE FOR ELECTRONIC DEVICES

(76) Inventors: Andrew John Whitehead, 60 Cheylesmore Drive, Camberley, Surrey (GB) GU 16 9BW; Christopher John Howard Wort, 61 Upthorpe Drive, Wantage, Oxfordshire (GB) OX12 7DG; Geoffrey Alan Scarsbrook, 40 Cavendish Mead, Sunninghill, Ascot, Berkshire (GB) SL5 9TD ( * ) Notice: Subject to any disclaimer, the term of this patent is extended or adjusted under 35 U.S.C. 154(b) by 276 days.

(21) Appl. No.: 11/909,204

(22) PCT Filed: Mar. 20, 2006

(86) PCT No.: PCT/IB2006/000609

§ 371 (c)(1),
(2), (4) Date: Nov. 27, 2007

(87) PCT Pub. No.: WO2006/100559

PCT Pub. Date: Sep. 28, 2006

(65) Prior Publication Data

US 2008/0206569 A1    Aug. 28, 2008

(30) Foreign Application Priority Data

Mar. 21, 2005    (GB) ................... 0505752.6

(51) Int. Cl.
*C30B 25/00* (2006.01)
(52) U.S. Cl. .............. 117/94; 117/84; 117/88; 117/90; 117/97; 117/101; 117/106; 117/915; 117/951
(58) Field of Classification Search ............ 117/84, 117/88, 90, 94, 97, 101, 106, 915, 951
See application file for complete search history.

(56) References Cited

U.S. PATENT DOCUMENTS 5,131,963 A * 7/1992 Ravi .................. 148/33.3

(Continued)

FOREIGN PATENT DOCUMENTS

WO    2005 074013    8/2005

OTHER PUBLICATIONS

A. Aleksov, et al., "Silicon-On-Diamond: An Advanced Silicon-On-Insulator Technology", Diamond and Related Materials, vol. 14, No. 3-7, XP 004857074, pp. 308-313, 2005.

(Continued)

*Primary Examiner*—Robert M Kunemund
*Assistant Examiner*—Matthew J Song
(74) *Attorney, Agent, or Firm*—Oblon, Spivak, McClelland, Maier & Neustadt, L.L.P.

(57) ABSTRACT

The invention relates to a method of manufacture of a substrate for fabrication of semiconductor layers or devices, comprising the steps of providing a wafer of silicon including at least one first surface suitable for use as a substrate for CVD diamond synthesis, growing a layer of CVD diamond of predetermined thickness and having a growth face onto the first surface of the silicon wafer, reducing the thickness of the silicon wafer to a predetermined level, and providing a second surface on the silicon wafer that is suitable for further synthesis of at least one semiconductor layer suitable for use in electronic devices or synthesis of electronic devices on the second surface itself and to a substrate suitable for GaN device growth consisting of a CVD diamond layer intimately attached to a silicon surface.

20 Claims, 1 Drawing Sheet

U.S. PATENT DOCUMENTS

Figure 1:
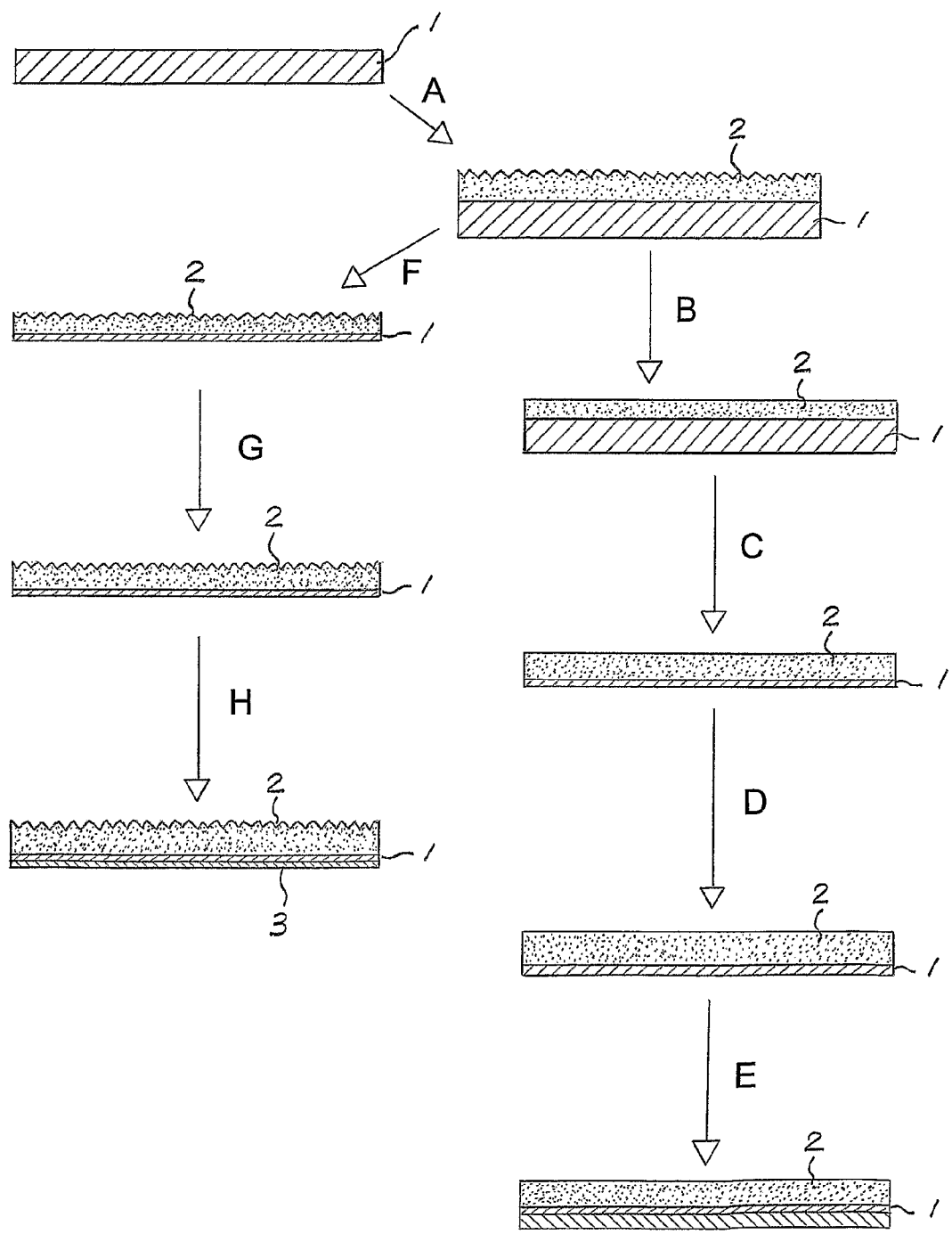

| | | | |
|---|---|---|---|
| 6,328,796 B1* | 12/2001 | Kub et al. | 117/94 |
| 6,428,399 B1* | 8/2002 | Tanabe et al. | 451/66 |
| 2002/0096106 A1 | 7/2002 | Kub et al. | |
| 2003/0219959 A1 | 11/2003 | Ghyselen et al. | |
| 2004/0191534 A1* | 9/2004 | Ravi | 428/446 |
| 2004/0256624 A1* | 12/2004 | Sung | 257/77 |
| 2005/0179126 A1* | 8/2005 | Ravi et al. | 257/706 |
| 2006/0113545 A1* | 6/2006 | Weber et al. | 257/77 |
| 2006/0113546 A1* | 6/2006 | Sung | 257/77 |

OTHER PUBLICATIONS

C. Z. Gu, et al., "Sod Wafer Technology", Microelectronic Engineering, vol. 66, No. 1-4, XP 004421560, pp. 510-516, 2003.

* cited by examiner

DIAMOND BASED SUBSTRATE FOR ELECTRONIC DEVICES

This invention relates to a method of providing substrates upon which semiconductor devices can be fabricated, which substrates demonstrate improved thermal conductivity. In particular, this invention relates to an improved substrate upon which gallium nitride (GaN) semiconductor devices can be fabricated.

BACKGROUND OF THE INVENTION

The performance of electronic devices is strongly related to the thermal properties of materials used in their fabrication. In particular, for high power devices, the more effectively the excess heat they produce is removed, the lower their operating temperature, the greater their efficiency, and the longer their lifetime. With devices becoming smaller and smaller and power densities rising, the management of the thermal aspects of device operation becomes increasingly important.

One class of semiconductor devices for which this invention is particularly suitable are those which use gallium nitride as the semiconducting component. Gallium nitride (GaN) is a wide band-gap semiconducting material with electronic properties that make it well suited to high power, high brightness, light emitting diodes (LEDs) and high power, high frequency (1-100 GHz) devices, for example p-High Electron Mobility Transistors (HEMTs). Currently available GaN devices use hexagonal gallium nitride monocrystalline layers grown epitaxially onto a variety of monocrystalline substrates, including: hexagonal sapphire, hexagonal silicon carbide and {111} silicon. However, there are disadvantages with each of these. The typical configuration is a wafer of the substrate material, for example 300 μm thick, onto which is grown a buffer layer of AlGaN with a thickness of the order of 1 μm or so, where the concentration of aluminium is varied to control the lattice parameter and reduce the interface strain, and then finally a layer of device quality GaN, which may typically have a thickness in the region of 10-50 nm, is grown on top of the buffer layer.

The substrate onto which GaN devices are grown is required to act as a heat spreader (but commonly referred to a heat sink), that is to initially spread and then remove the heat from the "hot-spots" within the GaN devices (generally generated at the junctions). Sapphire and silicon are readily available and relatively cheap, so sapphire tends to be used as the substrate for LEDs (where the light comes through the substrate, i.e. the substrate is required to be transparent in the visible spectrum), while silicon is used as a substrate for the high power Radio Frequency (RF) devices. (Silicon has a higher thermal conductivity than sapphire and so is better in applications where more heat is generated). However, both silicon and sapphire limit the power output of GaN devices grown on them because neither silicon nor sapphire have a very high thermal conductivity (<150 W/m·K and <45 W/m·K respectively). The thermal conductivity of GaN is itself not that high, typically about 130 W/m·K. Single crystal hexagonal silicon carbide (typically the 4 H or 6 H polytype) is both transparent and of high thermal conductivity (>500 W/m·K) so it would be the preferred substrate for all GaN devices if it were readily available in both large diameters and at low cost. However, this is not the case.

It is well known that CVD diamond can be grown onto both polycrystalline and monocrystalline silicon substrates, and that CVD diamond can have a thermal conductivity in excess of 1000 W/m·K, with the best material having a thermal conductivity in excess of 1800 W/m·K. It is less well known that CVD diamond and silicon are reasonably well matched in terms of thermal expansion coefficient, which allows thick diamond layers to be grown onto silicon surfaces.

SUMMARY OF THE INVENTION

According to the present invention there is provided a method of manufacture of a substrate for fabrication of semiconductor layers or devices, comprising the steps of:
Providing a wafer of silicon including at least one first surface suitable for use as a substrate for CVD diamond synthesis,
growing a layer of CVD diamond of predetermined thickness and having a growth face onto the first surface of the silicon wafer,
reducing the thickness of the silicon wafer to a predetermined level, and
providing a second surface on the silicon wafer that is suitable for further synthesis of at least one semiconductor layer suitable for use in electronic devices or synthesis of electronic devices on the second surface itself.

Preferably the silicon is monocrystalline silicon. Preferably the silicon wafer is processed such that at least the opposed large surfaces are substantially parallel. By parallel it is intended that an angle of each surface is no more 5 degrees, more preferably no more than 3 degrees, most preferably no more than 1 degree with respect the opposed surface of the wafer.

The term 'wafer' is intended to encompass a plate of silicon where one dimension (preferably height) is at least 2, more preferably at least 5, most preferably at least 10 times smaller than the other two dimensions.

In a preferred embodiment of the present invention the growth face of the CVD diamond layer is processed to become substantially flat and parallel to the first surface of the silicon wafer.

Preferably the second surface of the silicon wafer is opposed to the first surface of the wafer.

Preferably the growth face of the diamond layer is mounted against a substantially planar reference plate.

Preferably, and in particular where subsequent semiconductor layer growth is intended and the subsequent semiconductor layer or layers are GaN, the monocrystalline silicon wafer is a {111} monocrystalline silicon wafer. This does not exclude the use of other orientations of silicon monocrystalline wafers such as {100}, {110} or any other orientation.

Preferably the method according to the first aspect of the present invention further includes the step of growing GaN on the second surface of the silicon wafer, optionally using AlGaN buffer layers.

According to a preferred embodiment of the first aspect to the present invention, there is provided a method of producing GaN material comprising the steps of:
providing a wafer of monocrystalline silicon which has been processed so that the large {111} surfaces are parallel and at least a first surface is in a condition suitable for use as a substrate for CVD diamond synthesis,
growing a layer of CVD diamond of a predetermined thickness and having a growth face onto the first surface of the monocrystalline silicon wafer,
reducing the thickness of the silicon wafer to a predetermined level,
providing a second surface on the silicon wafer suitable for the further synthesis of semiconductor layers suitable for use in electronic devices, and
growing GaN on the second surface of the silicon wafer, optionally using AlGaN buffer layers.

Preferably the layer of CVD diamond on the {111} monocrystalline silicon wafer is greater than 100 µm, preferably greater than 300 µm, more preferably greater than 400 µm, even more preferably greater than 500 µm, and most preferably greater than 550 µm thick.

The processing of the first surface of the silicon wafer so that the surface is suitable for the deposition of CVD diamond can be accomplished by techniques known in the art, including diamond sawing into thin wafers, mechanical grinding to ensure that the wafers are flat and have parallel surfaces, and chemical polishing to ensure that the surfaces are free of defects introduced by mechanical processing.

Preferably the growth face of the CVD diamond layer is processed to become substantially flat and parallel to the first surface of the silicon wafer.

The processing of the growth face of the CVD diamond layer to be substantially flat and parallel to the first (upper) silicon surface (a reference surface) may be accomplished using diamond processing techniques well known in the art.

The processed diamond face may be mounted against a substantially planar reference plate.

Reduction of the thickness of the silicon wafer may be accomplished by using lapidary techniques well known in the art. Preferably the silicon wafer is reduced until it is less than 50 µm thick, preferably less than 20 µm thick, more preferably less than 10 µm thick and most preferably less than 5 µm thick.

The present invention provides the step of rendering the exposed (second) surface of the thinned silicon wafer suitable for the subsequent fabrication of silicon-based electronic devices and the deposition of further semiconductor layers such as GaN. The steps required are the same in both cases and are well known in the art.

In the preferred embodiment of the invention, a layer of GaN is deposited on the (second) prepared surface of the thinned silicon wafer with, optionally, the deposition of a GaN layer being preceded or combined with an AlGaN buffer layer, to further improve the lattice match for example, or as part of the GaN device structure.

The result in the case of the preferred embodiment is a substrate suitable for GaN device fabrication consisting of a bulk, polycrystalline CVD diamond layer (preferably >300 µm thick) which is intimately attached to a surface of a thin (preferably <20 µm), monocrystalline {111} silicon wafer. (The term 'intimately attached' is intended to encompass 'bonded'.)

This substrate has a far higher thermal performance than silicon carbide. It is also cheaper and readily available in large diameters.

According to a second aspect of the present invention there is provided a substrate suitable for GaN device growth consisting of a CVD diamond layer intimately attached to a surface of a silicon wafer. Preferably the wafer is a monocrystalline silicon wafer, most preferably a monocrystalline {111} silicon wafer.

Several parameters exist for optimisation of the method according to the present invention.

Firstly, it is advantageous to achieve good thermal conductivity through the nucleation layer of the diamond in contact with the silicon. The nucleation layer is preferably fully dense. This may be best achieved by a high nucleation density. High nucleation densities can be achieved by seeding methods such as those known in the art, typically using a suitable diamond grit and either mechanically or by other means (for example using ultrasonic processes) using this grit to abrade the surface of the silicon. It is also important to control the conditions of initial diamond grown. The nucleation density can be characterised by either total removal of the silicon, for example by etching, and then microscopy of the exposed surface, or by preparation of a cross-section etc.

Secondly, it is advantageous to keep the final product flat for device processing. This may require techniques to control stress in the diamond layer, or to compensate for any stress induced bowing which might otherwise occur. Techniques for controlling flatness are also known in the art, for example controlling growth and temperature uniformity across the wafer, pre-stressing substrates during mounting for synthesis in order to counter any ingrown stresses on release, or to clamp it flat, growth on slightly curved substrates etc.

Thirdly, the lattice constant of the monocrystalline silicon wafer can be modified by doping, or by isotopic control, to further match the silicon to device layers such as GaN grown on the surface(s) of the silicon wafer.

Finally, the CVD diamond layer may be thinner than 300 µm, and may be as thin as or thinner than 100 µm. In such circumstance, the CVD diamond layer is preferably present in combination with a further layer of a second material used to provide support or mechanical strength. This second material may comprise the reference plate. It will be appreciated that under this arrangement there is less need for this second material to be of high thermal conductivity, however it is preferable that the second material is compatible with device processing of the GaN. Where the diamond layer is so supported, this support may be attached for the stage of reducing the thickness of the silicon wafer, or it may be added after this stage.

In this configuration where the diamond layer is sandwiched between the silicon wafer and a support material, the diamond layer acts as a heat spreader thereby reducing the peak temperature of the electronic devices fabricated on the opposite surface of the silicon wafer. Typically the thickness of the diamond layer is at least as large as the larger of the characteristic device dimension and the separation of the electronic devices from the silicon-diamond interface, and generally substantially larger than this.

The invention will now be described with reference to the FIG. 1 which is a schematic illustration of a method of manufacture according to the present invention.

In FIG. 1 a silicon wafer 1 has an upper surface prepared for CVD diamond synthesis (step A). A CVD diamond layer 2 is grown on the silicon wafer 1. Through an optional planarisation step B the CVD diamond layer 2 is planarised. The silicon wafer 1 is then thinned in a thinning step C. An opposed surface of the silicon wafer 1 is then processed (step D) to be suitable for device fabrication or GaN epitaxial layer 3 deposition (step E).

Alternatively, the silicon wafer 1 can be thinned before the CVD diamond 2 is planarised (step F). Thereafter, an opposed surface of the silicon wafer 1 is then processed (step G) to be suitable for device fabrication or GaN epitaxial layer 3 deposition (step H).

EXAMPLE

The invention is further exemplified by the following non-limiting example.

A silicon wafer 2.0 mm thick and 2" in diameter was obtained from a commercial silicon source. The wafer was oriented to be such that the major surfaces were within 1° of the (111) plane. One surface of the wafer had been mechanically sawn and then lapped flat, the appearance of this surface was a matt-grey. The other surface had been sawn, lapped and then chemically polished to remove all mechanical damage, the appearance of this surface was mirror-like.

The mirror-like surface of the substrate was used as the surface upon which the CVD diamond layer was grown. The surface was seeded by immersing the wafer in a beaker containing a suspension of 2-4 μm diamond powder in propan-2-ol and then agitating ultrasonically for 30 minutes. After ultrasonic agitation, the excess seeding powder was washed off using propan-2-ol and the seeded wafer was dried using compressed argon.

The seeded substrate was placed inside a CVD diamond synthesis system. The system used was a microwave plasma assisted system operating at 2.45 GHz. The conditions used for synthesis were 16 kPa, with a forward power of ~3 kW, a total gas flow of 645 sccm (consisting of 20 sccm methane, 25 sccm argon, balance hydrogen). Growth was continued until the CVD layer reached a thickness of approximately 450 μm at which point the synthesis system was turned off.

The growth surface of the resultant CVD diamond layer on its silicon substrate was then lapped using standard diamond processing techniques until the whole surface was flat and parallel to silicon rear surface reference plane. At this point the Ra of the surface measured using a stylus profilometer was about 250 nm, the thickness of the diamond layer was 380 μm, and the front and back surfaces of the diamond layer on the silicon substrate were parallel to within ±10 μm.

After planarisation, the silicon-diamond wafer was turned over and the silicon substrate was lapped away until a wafer of silicon with a thickness of approximately 20 μm was left on the back surface of the CVD diamond layer. At this point the silicon surface was chemomechanically polished using 'Syton®' to achieve a damage free surface.

The object now consists of a layer of CVD diamond 380 μm thick with a 20 μm thick <111> silicon wafer intimately attached to its nucleation surface. The silicon wafer has a surface that is itself suitable for the fabrication of electronic devices, but can also be used as a substrate for the deposition of a thin GaN epitaxial layer by any method known in the art.

The invention claimed is:

1. A method of manufacture of a GaN material, the method comprising:
   providing a wafer of silicon including at least one first surface suitable for use as a substrate for CVD diamond synthesis,
   growing a layer of CVD diamond of a thickness greater than 300 μm and having a growth face onto the first surface of the silicon wafer,
   reducing the thickness of the silicon wafer to a predetermined level,
   providing a second surface on the silicon wafer that is suitable for further synthesis of at least one semiconductor layer suitable for use in electronic devices or synthesis of electronic devices on the second surface itself, and
   growing GaN on the second surface of the silicon wafer.

2. The method as claimed in claim 1, wherein the silicon is monocrystalline silicon.

3. The method as claimed in claim 2, wherein the monocrystalline silicon wafer is a {111} monocrystalline silicon wafer.

4. The method as claimed in claim 1, wherein the silicon wafer is processed such that at least the opposed large surfaces are substantially parallel.

5. The method as claimed in claim 1, wherein the growth face of the CVD diamond layer is processed to become substantially flat and parallel to the first surface of the silicon wafer.

6. The method as claimed in claim 1, wherein the second surface of the silicon wafer is opposed to- the first surface of the wafer.

7. The method as claimed in claim 1, wherein an AlGaN buffer layer is used.

8. The method according to claim 1, wherein reduction of the silicon wafer is accomplished by using lapidary techniques.

9. The method according to claim 1, wherein the silicon wafer is reduced until less than 50 μm thick.

10. The method according to claim 9, wherein the silicon wafer is reduced until less than 20 μm thick.

11. The method according to claim 9, wherein the silicon wafer is reduced until less than 10 μm thick.

12. The method according to claim 9, wherein the silicon wafer is reduced until less than 5 μm thick.

13. The method according to claim 1, further comprising polishing the silicon surface to a smooth surface suitable for the growth of GaN.

14. The method according to claim 1, wherein the GaN layer is preceded or combined with an AlGaN buffer layer.

15. A method of producing GaN material, the method comprising:
   providing a wafer of monocrystalline silicon which has been processed so that the large {111} surfaces are parallel and at least a first surface is in a condition suitable for use as a substrate for CVD diamond synthesis,
   growing a layer of CVD diamond of a thickness greater than 300 μm and having a growth face onto the first surface of the monocrystalline silicon wafer,
   reducing the thickness of the silicon wafer to a predetermined level,
   providing a second surface on the silicon wafer suitable for synthesis of semiconductor layers suitable for use in electronic devices, and
   growing GaN on the second surface of the silicon wafer.

16. The method as claimed in claim 15, further comprising processing the growth face of the CVD diamond layer to become substantially flat and parallel to the first surface of the silicon wafer.

17. The method as claimed in claim 16, further comprising mounting the processed diamond face against a substantially planar reference plate.

18. The method according to claim 15, wherein the layer of CVD diamond on the monocrystalline silicon wafer is greater than 400 μm.

19. The method according to claim 15, wherein the layer of CVD diamond on the monocrystalline silicon wafer is greater than 500 μm.

20. The method according to claim 15, wherein the layer of CVD diamond on the monocrystalline silicon wafer is greater than 550 μm.

* * * * *